United States Patent
Kong et al.

(10) Patent No.: US 8,963,191 B2
(45) Date of Patent: Feb. 24, 2015

(54) LIGHT EMITTING DEVICE PACKAGE AND LIGHTING SYSTEM

(75) Inventors: Jiun Kong, Seoul (KR); Il Seo, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 180 days.

(21) Appl. No.: 13/396,905

(22) Filed: Feb. 15, 2012

(65) Prior Publication Data

US 2012/0153337 A1 Jun. 21, 2012

(30) Foreign Application Priority Data

Jul. 29, 2011 (KR) .......................... 10-2011-0075935

(51) Int. Cl.
*H01L 33/38* (2010.01)
*H01L 33/00* (2010.01)
*H01L 33/62* (2010.01)
*H01L 33/60* (2010.01)

(52) U.S. Cl.
CPC ................. *H01L 33/62* (2013.01); *H01L 33/38* (2013.01); *H01L 33/60* (2013.01); *H01L 2924/0002* (2013.01)
USPC 257/99; 257/98; 257/E33.056; 257/E33.066; 438/26

(58) Field of Classification Search
CPC ............................. H01L 33/486; H01L 33/62
USPC ......... 257/98, 99, E3.006, E33.056, E33.058, 257/E33.066; 438/26
See application file for complete search history.

(56) References Cited

U.S. PATENT DOCUMENTS

| | | | |
|---|---|---|---|
| 5,265,792 A | 11/1993 | Harrah et al. | 228/6.2 |
| 5,670,797 A * | 9/1997 | Okazaki | 257/91 |
| 6,299,056 B1 * | 10/2001 | Oota | 228/177 |
| 7,012,277 B2 * | 3/2006 | Takenaka | 257/79 |
| 7,709,952 B2 * | 5/2010 | Park et al. | 257/717 |
| 2005/0205890 A1 * | 9/2005 | Uemura | 257/103 |
| 2006/0027827 A1 * | 2/2006 | Tain et al. | 257/99 |
| 2006/0043401 A1 * | 3/2006 | Lee et al. | 257/99 |
| 2007/0023771 A1 * | 2/2007 | Kim et al. | 257/94 |
| 2008/0087902 A1 * | 4/2008 | Lee et al. | 257/88 |
| 2008/0111146 A1 * | 5/2008 | Nakamura et al. | 257/98 |
| 2008/0122120 A1 * | 5/2008 | Itoh et al. | 257/784 |

(Continued)

OTHER PUBLICATIONS

European Search Report issued in Application No. 12155915.7 dated Nov. 21, 2014.

*Primary Examiner* — Cheung Lee
*Assistant Examiner* — Jeremy Joy
(74) *Attorney, Agent, or Firm* — Ked & Associates, LLP

(57) ABSTRACT

The light emitting device package includes a body provided with a cavity, a first lead frame mounted on the body, a second lead frame mounted on the body and separated from the first lead frame, and a light emitting device mounted in the cavity and disposed between the first lead frame and the second lead frame, the light emitting device is formed by sequentially stacking a first conductivity-type semiconductor layer, an active layer and a second conductivity-type semiconductor layer, the sequentially stacking direction of the first conductivity-type semiconductor layer, the active layer and the second conductivity-type semiconductor layer is parallel with the bottom surface of the cavity, the first lead frame includes a first connection part electrically connected to the first conductivity-type semiconductor layer, and the second lead frame includes a second connection part electrically connected to the second conductivity-type semiconductor layer.

18 Claims, 8 Drawing Sheets

(56) References Cited

U.S. PATENT DOCUMENTS

| | | | |
|---|---|---|---|
| 2009/0008673 A1* | 1/2009 | Kato et al. | 257/100 |
| 2009/0230417 A1* | 9/2009 | Tsai et al. | 257/98 |
| 2009/0267102 A1* | 10/2009 | Tsai et al. | 257/98 |
| 2010/0120182 A1* | 5/2010 | Kim | 438/27 |
| 2010/0133560 A1* | 6/2010 | Kim et al. | 257/89 |
| 2010/0308350 A1 | 12/2010 | Bisberg | 257/88 |
| 2011/0220950 A1* | 9/2011 | Kim et al. | 257/98 |

\* cited by examiner

LIGHT EMITTING DEVICE PACKAGE AND LIGHTING SYSTEM

CROSS-REFERENCE TO RELATED APPLICATION

This application claims the priority benefit of Korean Patent Application No. 10-2011-0075935, filed on Jul. 29, 2011 in the Korean Intellectual Property Office, the disclosure of which is incorporated herein by reference.

BACKGROUND

1. Field

Embodiments relate to a light emitting device package, and more particularly to a light emitting device package in which a light emitting device is disposed between lead frames so as to omit wire bonding.

2. Description of the Related Art

Light emitting diodes (LEDs) are devices which convert an electrical signal into light using characteristics of a compound semiconductor, and are used in household electric appliances, remote controllers, electronic bulletin boards, displays, various automated machines, etc., and using fields of the LEDs are gradually increased.

In general, a small LED is fabricated into a surface mount device type in order to be directly mounted on a printed circuit board (PCB), and thus an LED lamp used as a display device is developed into a surface mount device type. Such a surface mount device may substitute for conventional lamps, and may be used in a light-on/off display producing various colors, a letter indicator, an image display, etc.

In order to operate such an LED, the LED needs to be electrically connected to lead frames. If the LED is electrically connected to the lead frames through wire bonding, reliability of wire bonding becomes an issue.

BRIEF DESCRIPTION OF THE DRAWINGS

Details of the embodiments will be more clearly understood from the following detailed description taken in conjunction with the accompanying drawings, in which.

DETAILED DESCRIPTION OF EMBODIMENTS

Figure 1:
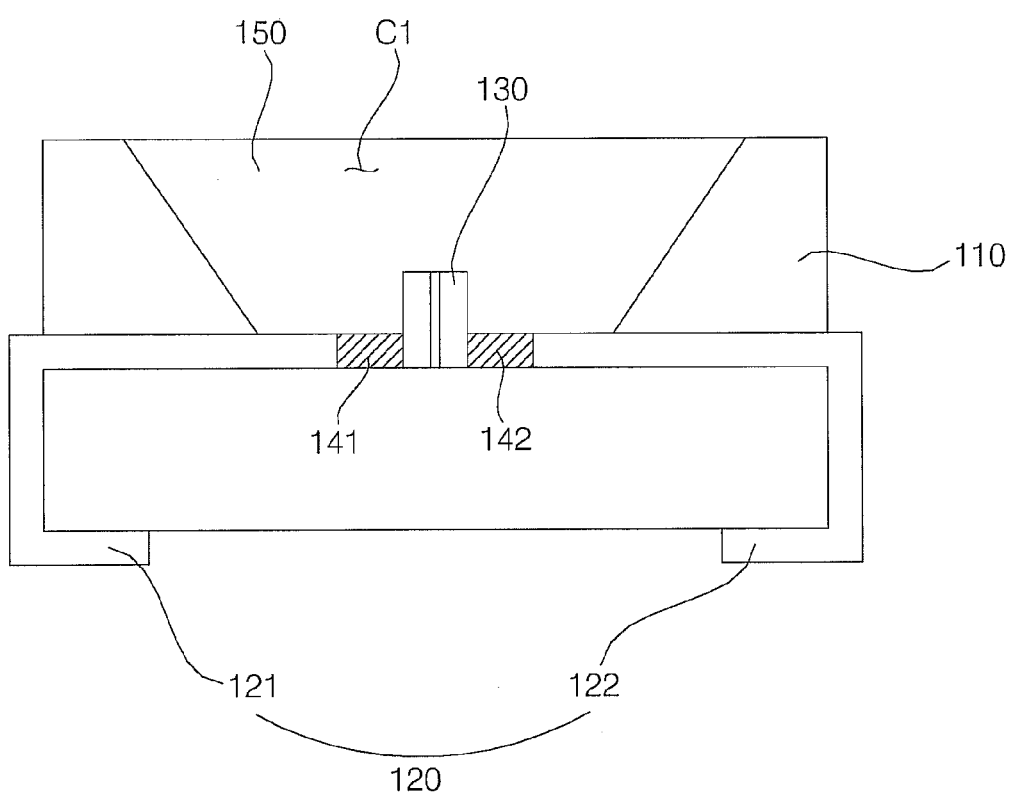
FIG. 1 is a cross-sectional view of a light emitting device package according to one embodiment.

Reference will now be made in detail to embodiments, examples of which are illustrated in the accompanying drawings. However, the present disclosure may be embodied in many different forms and should not be construed as limited to the embodiments set forth herein. Rather, these embodiments are provided so that this disclosure will be thorough and complete, and will fully convey the scope of the disclosure to those skilled in the art. The present disclosure is defined only by the categories of the claims. In certain embodiments, detailed descriptions of device constructions or processes well known in the art may be omitted to avoid obscuring appreciation of the disclosure by a person of ordinary skill in the art. Wherever possible, the same reference numbers will be used throughout the drawings to refer to the same or like parts.

Spatially-relative terms such as "below", "beneath", "lower", "above", or "upper" may be used herein to describe one element's relationship to another element as illustrated in the Figures. It will be understood that spatially-relative terms are intended to encompass different orientations of the device in addition to the orientation depicted in the Figures. For example, if the device in one of the figures is turned over, elements described as "below" or "beneath" other elements would then be oriented "above" the other elements. The exemplary terms "below" or "beneath" can, therefore, encompass both an orientation of above and below. Since the device may be oriented in another direction, the spatially-relative terms may be interpreted in accordance with the orientation of the device.

The terminology used in the present disclosure is for the purpose of describing particular embodiments only and is not intended to limit the disclosure. As used in the disclosure and the appended claims, the singular forms "a", "an" and "the" are intended to include the plural forms as well, unless context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the drawings, the thickness or size of each layer is exaggerated, omitted, or schematically illustrated for convenience of description and clarity. Also, the size or area of each constituent element does not entirely reflect the actual size thereof.

Angles or directions used to describe the structures of light emitting devices according to embodiments are based on those shown in the drawings. Unless there is, in the specification, no definition of a reference point to describe angular positional relations in the structures of the light emitting devices, the associated drawings may be referred to.

FIG. 1 is a cross-sectional view of a light emitting device package according to one embodiment.

With reference to FIG. 1, a light emitting device package 100 may include a body 110 provided with a cavity C1, lead frames 120 mounted on the body 110, a light emitting device 130 mounted in the cavity C1 and disposed between the lead frames 120, and a resin material 150 filling the cavity C1.

The body 110 serves as a housing, and the cavity C1 is formed at the center of the body 110 so that the light emitting device 130 may be mounted within the cavity C1.

Further, the body 110 surrounds and supports the lead frames 120, and may be formed of at least one selected from among the group consisting of a resin, such as polyphthalamide (PPA), silicon (Si), aluminum (Al), aluminum nitride (AlN), photo sensitive glass (PSG), polyamide 9T (PA9T), syndiotactic polystyrene (SPS), a metal, sapphire ($Al_2O_3$), beryllium oxide (BeO) and a printed circuit board (PCB).

Particularly, the body 110 may be formed of a light transmitting material, for example, epoxy resin, acrylic resin or silicon resin having light transmitting properties, without being not limited thereto. If the body 110 is formed of a light transmitting material, the light emitting device package 100 may emit light in the sideward direction and thus enables side lighting. The body 110 may be formed through injection molding, etching, etc., without being not limited thereto.

The cavity C1, the upper portion of which is opened, may be formed on the body 110, and the inner surface of the cavity C1 may be inclined. The angle of reflection of light emitted from the light emitting device 130 may be varied according to the angle of the inclined surface of the cavity C1, and thereby, the orientation angle of light emitted to the outside may be adjusted.

As the orientation angle of light decreases, convergence of light emitted from the light emitting device 130 to the outside increases, and on the other hand, as the orientation angle of light increases, convergence of light emitted from the light emitting device 130 to the outside decreases.

The shape of the cavity C1 formed on the body 110 seen from the top may be a circle, a rectangle, a polygon or an oval, and particularly, may be a shape having curved corners, without being not limited thereto.

The lead frames 120 may be formed of a metal, for example, at least one selected from the group consisting of titanium (Ti), copper (Cu), nickel (Ni), gold (Au), chromium (Cr), tantalum (Ta), platinum (Pt), tin (Sn), silver (Ag), phosphorus (P), aluminum (Al), indium (In), palladium (Pd), cobalt (Co), silicon (Si), germanium (Ge), hafnium (Hf), ruthenium (Ru) and iron (Fe), or an alloy thereof. Further, the lead frames 120 may be formed to have a single layer structure or a multi-layer structure, without being not limited thereto.

Further, the lead frames 120 may include a first lead frame 121 and a second lead frame 122 so as to apply different power thereto. Here, the first lead frame 121 and the second lead frame 122 may be separated from each other by a designated interval.

The light emitting device 130 is a kind of semiconductor device which is disposed between the first lead frame 121 and the second lead frame 122 and emits light of a designated wavelength by power applied from the outside, and may be formed based on a group III-V compound, such as gallium nitride (GaN), aluminum nitride (AlN), indium nitride (InN), gallium arsenide (GaAs), etc. For example, the light emitting device 130 may be a light emitting diode.

For example, such a light emitting diode may be a light emitting diode which emits red, green, blue or white light, or an ultraviolet light emitting diode which emits ultraviolet light, without being not limited thereto. Although this embodiment illustrates a single light emitting diode provided at the central portion of the light emitting device package 100, plural light emitting diodes may be provided on the light emitting device package 100.

Further, the light emitting device 130 may be a horizontal type light emitting device provided with electrical terminals formed on the upper surface thereof, or a vertical type light emitting device provided with electrical terminals formed on the upper and lower surfaces thereof.

Figure 2:
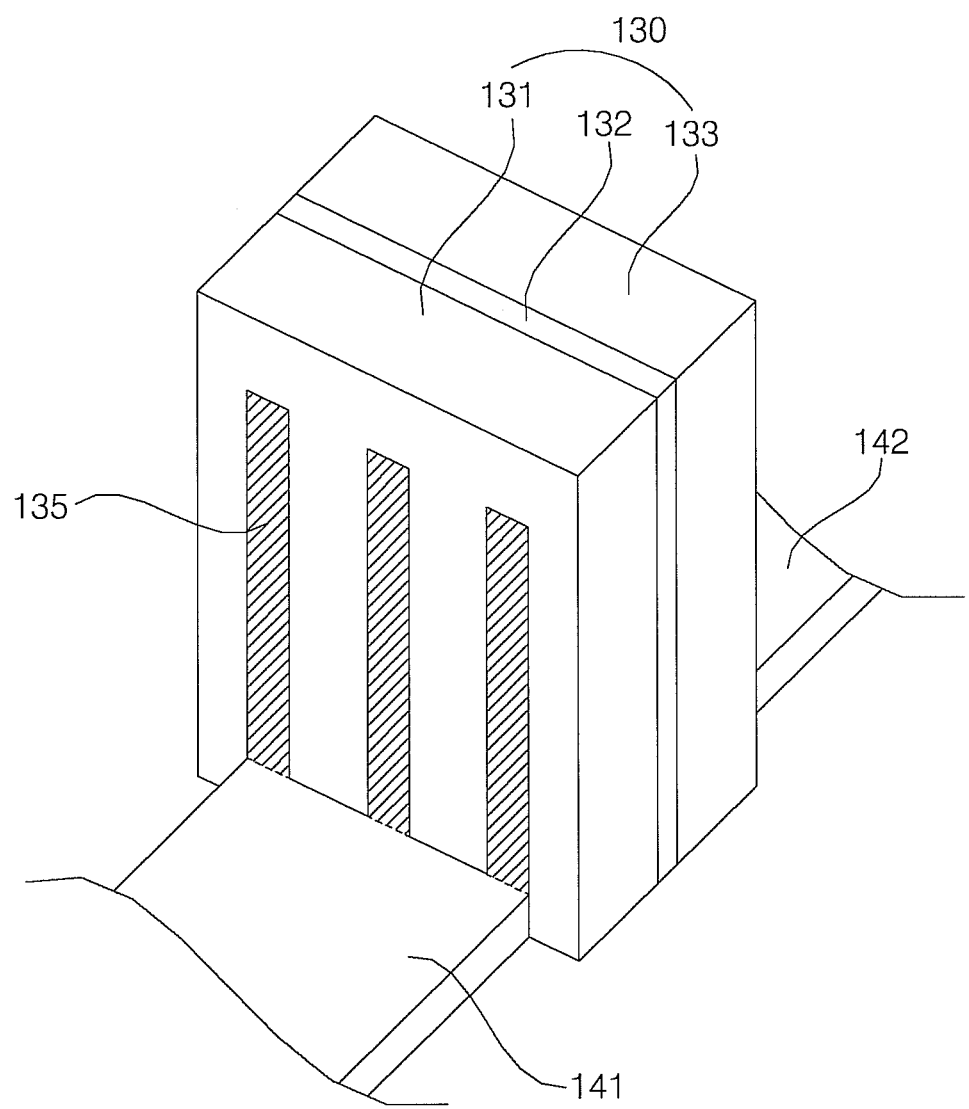
FIG. 2 is an enlarged perspective view of a light emitting device shown in FIG. 1.

With reference to FIG. 2, the light emitting device 130 may include a structure in which a first conductive type semiconductor layer 131, an active layer 132 and a second conductive type semiconductor layer 133 are sequentially stacked.

The first conductive type semiconductor layer 131 may be formed of a semiconductor material having a formula of $Al_xIn_yGa_{(1-x-y)}N$ ($0 \leq x \leq 1$, $0 \leq y \leq 1$ $0 \leq x+y \leq 1$), for example, at least one selected from the group consisting of GaN, InN, AlN, InGaN, AlGaN, InAlGaN and AlInN. Here, N may be replaced with other group V elements. For example, the first conductive type semiconductor layer 131 may be formed of at least one selected from the group consisting of AlGaAs, InGaAs, AlInGaAs, GaP, AlGaP, InGaP, AlInGaP and InP. For example, if the first conductive type semiconductor layer 131 is an N-type semiconductor layer, an N dopant may include Si, Ge, Sn, Se or Te.

The active layer 132 may be formed on one surface of the first conductive type semiconductor layer 131. The active layer 132 is a region where electrons and holes are recombined, transitions to a low energy level according to recombination of electrons and holes, and generates light having a corresponding wavelength.

The active layer 132 may be formed of a semiconductor material having a formula of $In_xAl_yGa_{1-x-y}N$ ($0 \leq x \leq 1$, $0 \leq y \leq 1$ $0 \leq x+y \leq 1$), and may have a single quantum well structure or a multi-quantum well (MQW) structure.

Therefore, a larger number of electrons are collected in a low energy level of a quantum well layer, and consequently, the possibility of electron and hole recombination increases to improve light emitting effects. Further, the active layer 132 may have a quantum wire structure or a quantum dot structure.

The second conductive type semiconductor layer 133 may be formed on one surface of the active layer 132. The second conductive type semiconductor layer 133 may be a P-type semiconductor layer, and may inject holes into the active layer 132. For example, the P-type semiconductor layer may be formed of a semiconductor material having a formula of $In_xAl_yGa_{1-x-y}N$ $0 \leq x \leq 1$, $0 \leq y \leq 1$ $0 \leq x+y \leq 1$), for example, at least one selected from the group consisting of GaN, AlN, AlGaN, InGaN, InN, InAlGaN and AlInN, and may be doped with a P-type dopant of Mg, Zn, Ca, Sr or Ba.

Further, a third conductive type semiconductor layer (not shown) may be formed on one surface of the second conductive type semiconductor layer 133. Here, the third conductive type semiconductor layer may be a semiconductor layer of opposite polarity to the second conductive type semiconductor layer 133.

The above-described first conductive type semiconductor layer 131, active layer 132 and second conductive type semiconductor layer 133 may be formed through metal organic chemical vapor deposition (MOCVD), chemical vapor deposition (CVD), plasma-enhanced chemical vapor deposition (PECVD), molecular beam epitaxy (MBE), hydride vapor phase epitaxy (HVPE) or sputtering, without being not limited thereto.

Further, differently from the above description, the first conductive type semiconductor layer 131 may be a P-type semiconductor layer and the second conductive type semiconductor layer 133 may be an N-type semiconductor layer, but the disclosure is not limited thereto.

The light emitting device 130 may be mounted in the cavity C1 such that the stacking direction of the first conductive type semiconductor layer 131, the active layer 132 and the second conductive type semiconductor layer 133 is parallel with the bottom surface of the cavity C1.

When the light emitting device 130 is mounted in the above manner, light generated by the active layer 132 is not concentrated in the upward direction of the light emitting device package 100 and travels in the sideward direction of the light emitting device package 100, thereby widening a light distribution pattern of the light emitting device package 100.

Further, if the body 110 is formed of a light transmitting material, as described above, light emitted from the light emitting device 130 travels in the sideward direction, thereby enabling side lighting.

With reference to FIG. 2, an electrode pattern 135 to improve current spreading of the light emitting device 130 may be formed on one surface of the first conductive type semiconductor layer 131 or the second conductive type semiconductor layer 133. The electrode pattern 135 serves to electrically connect the light emitting device 130 to a first connection part 141 or a second connection part 142, and may be formed in various shapes.

The electrode pattern 135 may be formed of a conductive material, for example, one selected from the group consisting of indium (In), cobalt (Co), silicon (Si), germanium (Ge), gold (Au), palladium (Pd), platinum (Pt) ruthenium (Ru), rhenium (Re), magnesium (Mg), zinc (Zn), hafnium (Hf), tantalum (Ta), rhodium (Rh), iridium (Ir), tungsten (W), titanium (Ti), silver (Ag), chromium (Cr), molybdenum (Mo), niobium (Nb), aluminum (Al), nickel (Ni) and copper (Cu), or an alloy of at least two selected from the group, and may be formed by stacking at least two different materials.

The electrode pattern 135 may include several bending parts to maximize current spreading, as shown in FIG. 2, without being not limited thereto.

With reference to FIG. 1, the first lead frame 121 may include the first connection part 141 electrically connected to the first conductive type semiconductor layer 131, and the second lead frame 122 may include the second connection part 142 electrically connected to the second conductive type semiconductor layer 133.

The first connection part 141 and the second connection part 142 may be formed of a conductive material, and may selectively use a light transmitting conductive layer and a metal. For example, the first connection part 141 and the second connection part 142 may be formed of at least one selected from the group consisting of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), ZnO, $IrO_x$, $RuO_x$, NiO, $RuO_x$/ITO, Ni/$IrO_x$/Au, Ni/$IrO_x$/Au/ITO, silver (Ag), nickel (Ni), chromium (Cr), titanium (Ti), aluminum (Al), rhodium (Rh), palladium (Pd), iridium (Ir), tin (Sn), indium (In), rubidium (Ru), magnesium (Mg), zinc (Zn), platinum (Pt), gold (Au), hafnium (Hf) and copper (Cu), without being not limited thereto. Further, the first connection part 141 and the second connection part 142 may be formed of the same material as the electrode pattern 135.

The cavity C1 may be filled with the resin material 150 to seal the light emitting device 130. Here, the resin material 150 may be a light transmitting resin material, such as silicon or epoxy, and may be formed by filling the cavity C1 with such a material and then hardening the material using ultraviolet light or heat.

The surface of the resin material 150 may have a concave lens shape, a convex lens shape, a flat shape, etc, and an orientation angle of light emitted from the light emitting device 130 may be changed according to the shape of the resin material 150.

Further, another resin material having a lens shape may be formed on or attached to the upper surface of the resin material 150, but the disclosure is not limited thereto.

The resin material 150 may include phosphors. Here, a kind of the phosphors is selected according to the wavelength of light emitted from the light emitting device 130, thereby producing white light.

That is, the phosphors may be excited by light of a first wavelength range, emitted from the light emitting device 130, and then generate light of a second wavelength range. For example, if the light emitting device 130 is a blue light emitting diode and the phosphors are yellow phosphors, the yellow phosphors may be excited by blue light and then emit yellow light, blue light emitted from the blue light emitting diode and yellow light emitted from the phosphors excited by blue light are mixed, thereby allowing the light emitting device package 100 to provide white light.

Similarly, if the light emitting device 130 is a green light emitting diode, magenta phosphors may be used or both blue and red phosphors may be used, and if the light emitting device 130 is a red light emitting diode, cyan phosphors may be used or both blue and green phosphors may be used.

These phosphors may be known YAG-based, TAG-based, sulfur-based, silicate-based, aluminate-based, nitride-based, carbide-based, nitridosilicate-based, borate-based, fluoride-based and phosphate-based phosphors.

Figure 3:
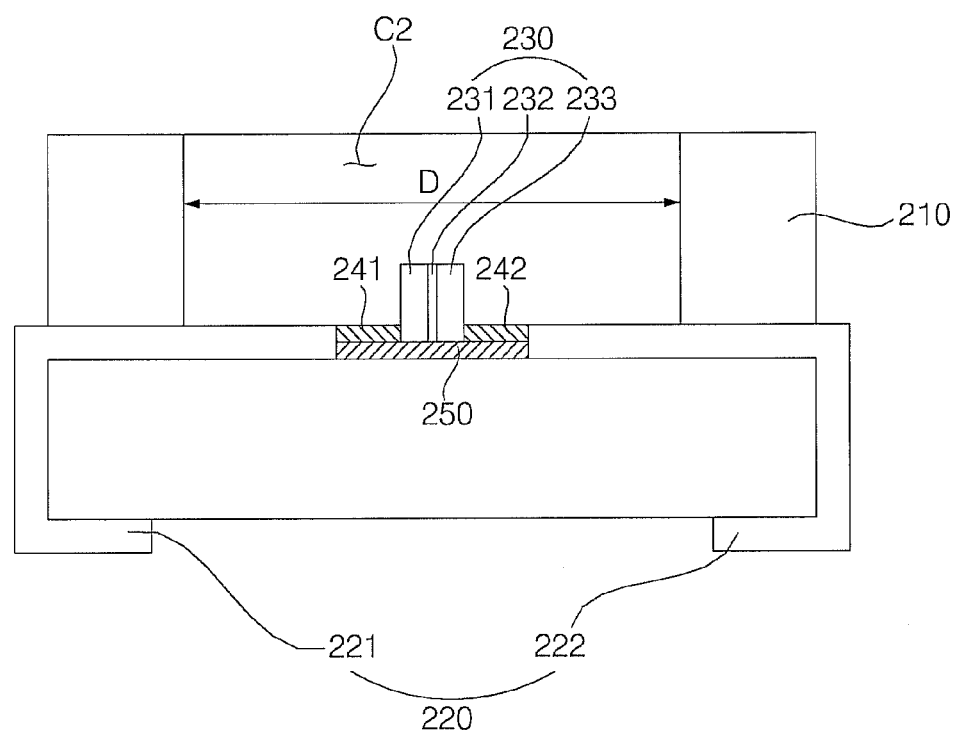
FIG. 3 is a cross-sectional view of a light emitting device package according to another embodiment.

FIG. 3 is a cross-sectional view of a light emitting device package in accordance with another embodiment.

With reference to FIG. 3, a width D of a cavity C2 formed on a body 210 may be regular in the upward direction. If the width D of the cavity C2 is regular, the overall width of a light emitting device package 200 may be reduced differently from the cavity C1 having a width gradually increased in the upward direction shown in FIG. 1, thereby allowing the light emitting device package 200 to be slimed. Further, an amount of emitted light per emitting area may be increased, and thus brightness may be increased.

Further, a reflective layer (not shown) may be formed on the inner surface of the cavity C2. When the reflective layer (not shown) is formed, the reflective layer (not shown) reflects light, emitted from a light emitting device 230 toward the inner surface of the cavity C2, in the upward direction of the light emitting device package 200, thereby improving light extraction efficiency of the light emitting device package 200.

For example, the reflective layer (not shown) may include a metal, such as silver (Ag) or aluminum (Al), or may be formed by stacking several layers having different indexes of refraction, without being not limited thereto.

Further, an adhesive layer 250 may be located at least one of between the light emitting device 230 and the body 210, between a first connection part 241 and the body 210, and between a second connection part 242 and the body 210.

The adhesive layer 250 may have an adhesive property so as to stably mount the light emitting device 230 in the cavity C2, and may have an insulating property so as to prevent shorts among a first conductive type semiconductor layer 231, an active layer 232 and a second conductive type semiconductor layer 233.

Figure 4:
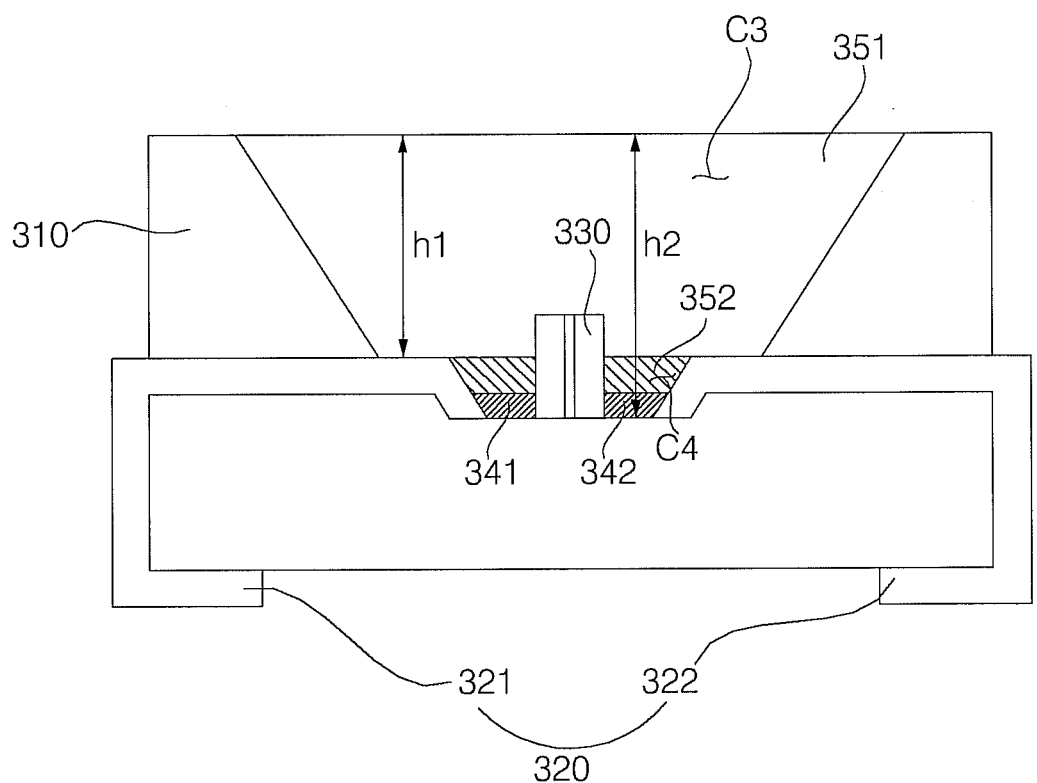
FIG. 4 is a cross-sectional view of a light emitting device package according to another embodiment.

FIG. 4 is a cross-sectional view of a light emitting device package in accordance with another embodiment.

With reference to FIG. 4, a light emitting device package 300 may include a first cavity C3 and a second cavity C4. The first cavity C3 may have a first depth h1 and the second cavity C4 may have a second depth h2 greater than the first depth h1. The second cavity C4 may be formed on the bottom surface of the first cavity C3, without being not limited thereto.

Further, as shown in FIG. 4, at least one area of each of lead frames 320 may be bent according to the shapes of the first cavity C3 and the second cavity C4, but the disclosure is not limited thereto. Here, a reflective layer (not shown) may be formed on inclined planes of the lead frames 320. When the reflective layer (not shown) is formed, the reflective layer (not shown) reflects light, emitted from a light emitting device 330 toward the inclined planes of the lead frames 320, in the upward direction of the light emitting device package 300.

The light emitting device 330 may be mounted in the second cavity C4, and may be disposed between a first lead frame 321 and a second lead frame 322. Therefore, the light emitting device 330 may be mounted more deeply than the bottom surface of the first cavity C3.

A second resin layer 352 may be formed by filling at least one area of the second cavity C4 in which the light emitting device 330 is disposed, with a resin material. When the second cavity C4 is filled with the resin material, the light emitting device 330 may be mounted more reliably. Further, the resin material may be epoxy resin, acrylic resin or silicon resin having light transmittance, without being not limited thereto. Further, a first resin layer 351 may be formed by filling at least one area of the first cavity C3 with a resin material.

The light emitting device packages in accordance with the above-described embodiments shown in FIGS. 1 to 4 may constitute a lighting system, and the lighting system may include a lighting apparatus or a backlight unit. Hereinafter, a lighting apparatus and a backlight unit will be described.

Figure 5A:
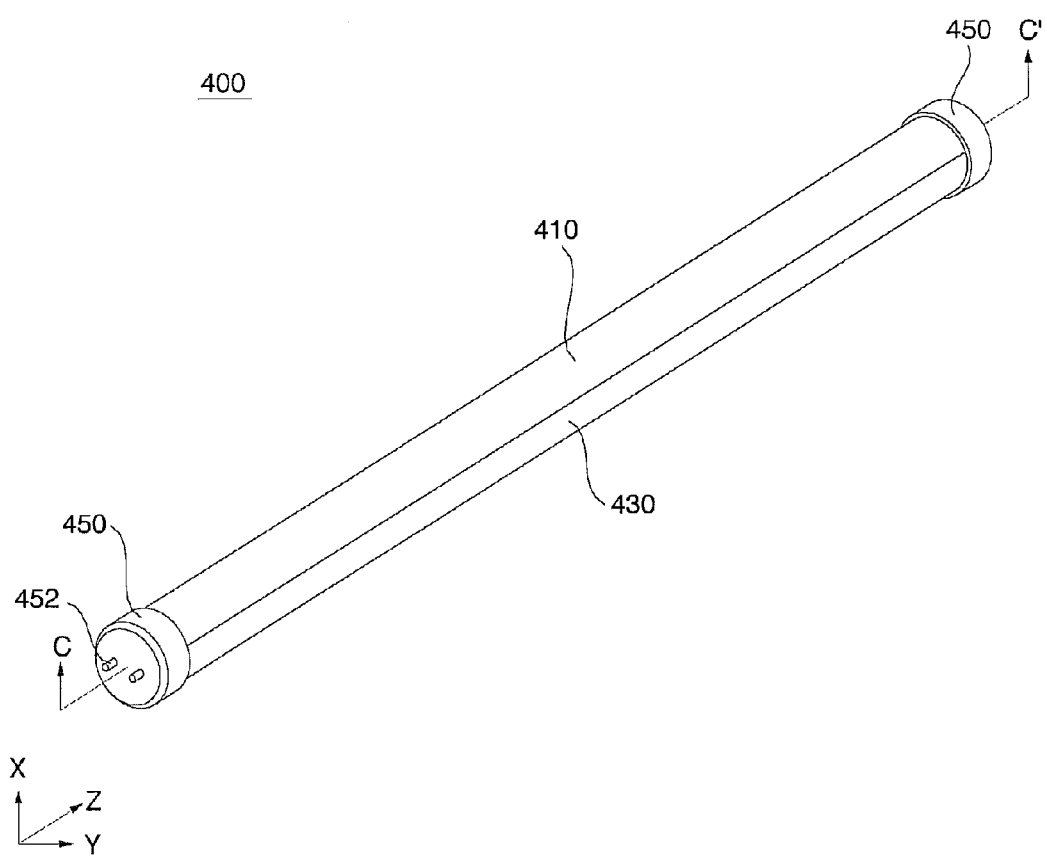
FIG. 5A is a perspective view illustrating a lighting apparatus according to one embodiment.
Figure 5B:
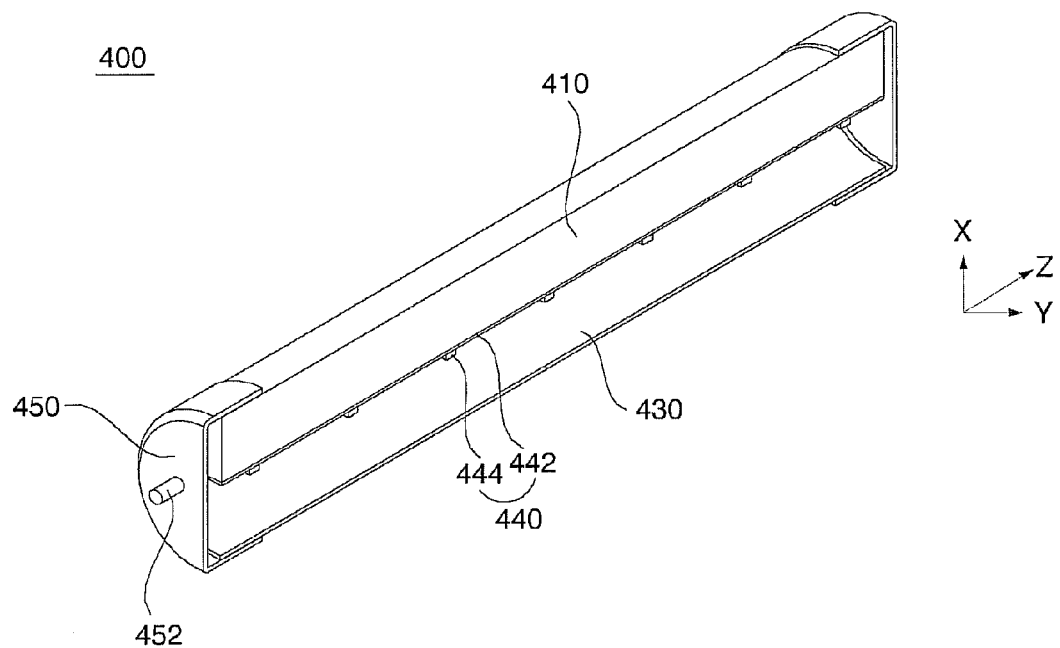
FIG. 5B is a cross-sectional view taken along the line C-C' of the lighting apparatus of FIG. 5A.

FIG. 5A is a perspective view illustrating a lighting apparatus in accordance with one embodiment, and FIG. 5B is a cross-sectional view taken along the line C-C' of the lighting apparatus of FIG. 5A.

Hereinafter, in order to illustrate the shape of a lighting apparatus 400 in accordance with this embodiment in more detail, a length direction Z of the lighting apparatus 400, a horizontal direction Y vertical to the lengthwise direction Z, and a height direction X vertical to the length direction Z and the horizontal direction Y will be described.

That is, FIG. 5B is a cross-sectional view produced by cutting the lighting apparatus 400 of FIG. 5A along the planes in the length direction Z and the height direction X, and seen in the horizontal direction Y.

With reference to FIGS. 5A and 5B, the lighting apparatus 400 includes a body 410, a cover 430 coupled with the body 410, and end caps 450 located at both ends of the body 410.

A light emitting device module 440 is coupled with the lower surface of the body 410, and the body 410 may be formed of a metal having excellent conductivity and heat dissipation effects so as to discharge heat generated from light emitting device packages 444 to the outside through the upper surface of the body 410.

The light emitting device packages 440 emitting light of multiple colors may be mounted on a PCB 442 in multiple rows to form an array. The light emitting device packages 440 may be mounted on the PCB 442 by the same interval or by various separation distances at need, thereby being capable of adjusting brightness. As such a PCB 442, a metal core PCB (MCPCB) or a PCB formed of FR4 may be used.

The light emitting device package 444 may include a film provided with a plurality of holes and formed of a conductive material.

The film made of a conductive material, such as a metal, may cause optical interference and thus increase the intensity of optical waves due to interaction of the optical waves to effectively extract and diffuse light, and the plural holes formed on the film may facilitate effective extraction of light through interference and diffraction of light generated from the light source unit. Therefore, efficiency of the lighting apparatus 400 may be improved. Here, the size of the plural holes formed on the film may be smaller than the wavelength of light generated from the light source unit.

The cover 430 may be formed in a cylindrical shape to surround the lower surface of the body 410, without being not limited thereto.

The cover 430 protects the light emitting device module 430 installed therein from external foreign substances. Further, the cover 430 may include light diffusing particles to prevent glare of light generated from the light emitting device packages 444 and to uniformly discharge light to the outside, and a prism pattern may be formed on at least one of the inner surface and the outer surface of the cover 430. Further, phosphors may be applied to at least one of the inner surface and the outer surface of the cover 430.

The cover 430 has excellent light transmittance so as to discharge light generated from the light emitting device packages 444 to the outside through the cover 430, and sufficient heat resistance so as to withstand heat generated from the light emitting device packages 444. Therefore, the cover 430 may be formed of a material including polyethylene terephthalate (PET), polycarbonate (PC) or polymethylmethacrylate (PMMA).

The end caps 450 may be located at both ends of the body 410 and be used to seal a power supply device (not shown). Further, power pins 452 are formed on the end caps 450, and thus the lighting apparatus 400 in accordance with this embodiment may be attached to terminals, from which a conventional fluorescent lamp is removed, without a separate device.

Figure 6:
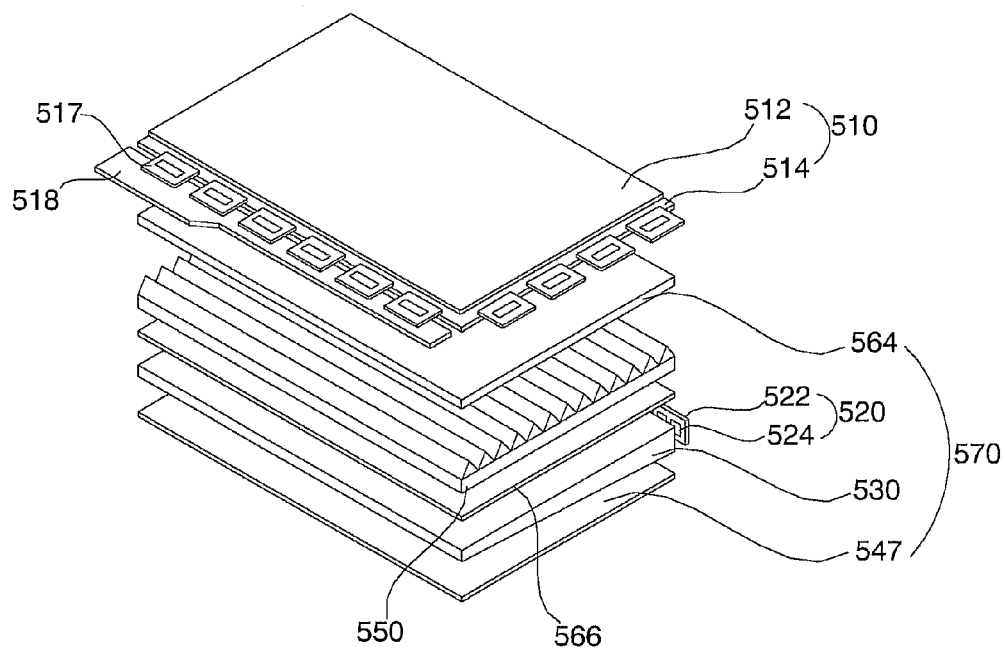
FIG. 6 is an exploded perspective view illustrating a backlight unit according to one embodiment.

FIG. 6 is an exploded perspective view illustrating a backlight unit in accordance with one embodiment.

FIG. 6 illustrates an edge light type backlight unit 570, and a liquid crystal display apparatus 500 includes a liquid crystal display panel 510 and the backlight unit 570 to supply light to the liquid crystal display panel 510.

The liquid crystal display panel 510 may display an image using light supplied from the backlight unit 570. The liquid crystal display panel 510 may include a color filter substrate 512 and a thin film transistor substrate 514 being opposite to each other under the condition that liquid crystals are interposed therebetween.

The color filter substrate 512 may produce color of the image displayed through the liquid crystal display panel 510.

The thin film transistor substrate 514 is electrically connected to a printed circuit board 518 on which a plurality of circuit parts are mounted through a drive film 517. The thin film transistor substrate 514 may apply drive voltage supplied from the printed circuit board 518 in response to a drive signal supplied from the printed circuit board 518.

The thin film transistor substrate 514 may include thin film transistors and pixel electrodes formed on a substrate formed of a transparent material, such as glass or plastic.

The backlight unit 570 includes a light emitting device module 520 outputting light, a light guide panel 530 to convert light supplied from the light emitting device module 520 into surface light and then to supply the surface light to the liquid crystal display panel 510, a plurality of films 550, 560 and 564 to uniformize bright distribution of light supplied from the light guide panel 530 and to improve vertical incident properties, and a reflective sheet 547 to reflect light emitted from the rear surface of the light guide panel 530 toward the light guide panel 530.

The light emitting device module 520 may include a plurality of light emitting device packages 524, and a PCB 522 on which the plural light emitting device packages 524 are mounted to form an array.

Particularly, the light emitting device package 524 includes a film provided with a plurality of holes on a light emitting surface thereof, and may thus omit a lens, thereby having a slim structure and improving light extraction efficiency. Therefore, a thinner backlight unit 570 may be implemented.

The plural films 550, 566 and 564 of the backlight unit 570 may include a diffusion film 566 to diffuse light incident from the light guide panel 530 toward the liquid crystal display panel 510, a prism film 550 to concentrate diffused light to improve vertical incident properties, and a protective film 564 to protect the prism film 550.

Figure 7:
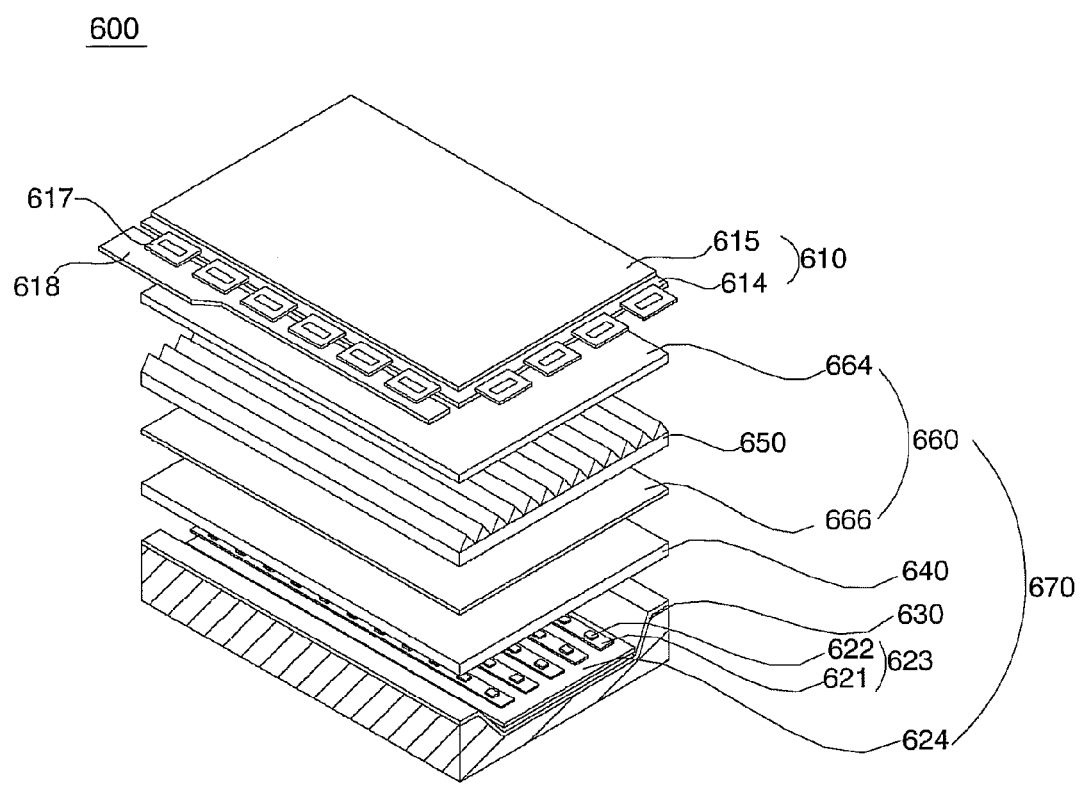
FIG. 7 is an exploded perspective view illustrating a backlight unit according to another embodiment.

FIG. 7 is an exploded perspective view illustrating a backlight unit in accordance with another embodiment.

Here, a description of components of FIG. 7 which are substantially the same as those of FIG. 6 will be omitted.

FIG. 7 illustrates a direct type backlight unit 670, and a liquid crystal display apparatus 600 includes a liquid crystal display panel 610 and the backlight unit 670 to supply light to the liquid crystal display panel 510.

The liquid crystal display panel 610 is the same as the liquid crystal display panel 510 of FIG. 6, and a detailed description thereof will thus be omitted.

The backlight unit 670 may include a plurality of light emitting device modules 623, a reflective sheet 624, a bottom chassis 630 in which the light emitting device modules 623 and the reflective sheet 624 are received, a diffusion plate 640 disposed above the light emitting device modules 623, and a plurality of optical films 660.

The light emitting device module 623 may include a PCB 621 on which a plurality of light emitting device packages 622 is mounted to form an array.

Particularly, the light emitting device package 622 includes a film formed of a conductive material and provided with a plurality of holes on a light emitting surface thereof, and may thus omit a lens, thereby having a slim structure and improving light extraction efficiency. Therefore, a thinner backlight unit 670 may be implemented.

The reflective sheet 624 reflects light emitted from the light emitting device packages 622 toward the liquid crystal display panel 610, thus improving light efficiency.

Light emitted form the light emitting device modules 623 is incident upon the diffusion plate 640, and the optical films 660 are disposed above the diffusion plate 640. The optical films 660 include a diffusion film 666, a prism film 640 and a protective film 664.

In the light emitting device packages and the lighting systems including the lighting apparatus and the backlight unit in accordance with the embodiments, a light emitting device is mounted upright and is thus electrically connected to lead frames without wire bonding. Therefore, lowering of brightness of light emitted from the light emitting device package due to wires may be prevented, production costs according to wire bonding may be reduced, and process steps may be simplified. Further, lighting in a different direction from the conventional light emitting device package may be enabled.

Although embodiments have been described with reference to a number of illustrative embodiments thereof, it should be understood that numerous other modifications and applications may be devised by those skilled in the art that will fall within the intrinsic aspects of the embodiments. More particularly, various variations and modifications are possible in concrete constituent elements of the embodiments. In addition, it is to be understood that differences relevant to the variations and modifications fall within the spirit and scope of the present disclosure defined in the appended claims.

What is claimed is:

1. A light emitting device package comprising:
a body having first and second surfaces, a plurality of side surfaces provided between the first and second surfaces, and a cavity formed on the first surface;
a first lead frame extending from a first side surface and through the body such than a first end protrudes into the cavity;
a second lead frame extending from a second side surface and through the body such that a first end protrudes into the cavity, wherein a gap is provided between the first end of the first lead frame and the first end of the second lead frame;
a light emitting device provided between the gap, the light emitting device having layers of a first conductive type semiconductor layer, an active layer and a second conductive type semiconductor layer, the layers being stacked in a direction parallel to a bottom surface of the cavity, wherein the first end of the first lead frame includes a first light transmissive electrode, and the first end of the second lead frame includes a second light transmissive electrode, the light emitting device electrically contacting the first and second light transmissive electrodes; and
an adhesive layer in contact with the light emitting device, the bottom of the cavity, and the first and second light transmissive electrodes.

2. The light emitting device package according to claim 1, wherein an electrode pattern is formed on at least one of the first conductive type semiconductor layer or the second conductive type semiconductor layer, and in contact with the first light transmissive electrode or the second light transmissive electrode, the electrode being formed by a plurality of electrode strips in a prescribed arrangement.

3. The light emitting device package according to claim 2, wherein the electrode pattern, the first light transmissive electrode and the second light transmissive electrode are made of the same material.

4. The light emitting device package according to claim 1, wherein the first and second light transmissive electrodes are formed over the adhesive layer and have a thinner thickness than the first and second lead frames.

5. The light emitting device package according to claim 1, wherein a reflective layer is disposed on the inner surface of the cavity.

6. The light emitting device package according to claim 5, wherein the reflective layer includes silver (Ag) or aluminum (Al).

7. The light emitting device package according to claim 1, further comprising a resin material filling the cavity, the resin material being at least one of phosphor or a light diffusing agent.

8. The light emitting device package according to claim 7, wherein the first and second lead frames wrap around the first and second side surfaces, respectively, and include second ends terminating at the second surface.

9. A light emitting device package comprising:
a body first and second surfaces, a plurality of side surfaces between the first and second surfaces, a first cavity formed on the first surface, and a second cavity formed on a bottom surface of the first cavity, the first cavity having a first depth from the first surface to the bottom surface of the first cavity and a second cavity having a second depth from the bottom surface of the first cavity to a bottom surface of the second cavity, wherein the first depth is greater than the second depth;

a first lead frame extending from a first side surface and through the body such that a first end of the first lead frame terminates at the bottom surface of the second cavity;

a second lead frame extending from a second side surface and through the body such the first end of the second lead frame terminates at the bottom surface of the second cavity, wherein a gap is provided between the first ends of the first and second lead frames at the bottom surface of the second cavity; and a light emitting device provided between the gap, and electrically contacting the first ends of the first and second lead frames, the light emitting device having layers of a first conductive type semiconductor layer, an active layer and a second conductive type semiconductor layer, the layers being stacked in a direction parallel to the bottom surface of the second cavity, wherein the light emitting device has a prescribed height in a direction perpendicular to the bottom surface of the second cavity, and the prescribed height is greater than the second depth of the second cavity such that light emitting device protrudes into the first cavity.

10. The light emitting device package according to claim 9, wherein at least one of the first end of the first lead frame or the second lead frame includes a light transmissive electrode.

11. The light emitting device package according to claim 9, further comprising an adhesive layer in contact with the light emitting device, the bottom of the cavity, and the first and second light transmissive electrodes.

12. The light emitting device package according to claim 9, wherein an electrode pattern is formed on at least one of the first conductive type semiconductor layer or the second conductive type semiconductor layer, and in contact with the first light transmissive electrode or the second light transmissive electrode, the electrode pattern being formed by a plurality of electrodes strips in a prescribed arrangement.

13. The light emitting device package according to claim 9, wherein the electrode pattern, the first light transmissive electrode and the second light transmissive electrode are made of the same material.

14. The light emitting device package according to claim 9, wherein a reflective layer is disposed on the inner surfaces of the first and second cavities.

15. The light emitting device package according to claim 14, wherein the reflective layer includes silver (Ag) or aluminum (Al).

16. The light emitting device package according to claim 9, wherein a first resin layer is disposed in the first cavity, a second resin layer is disposed in the second cavity and the first resin layer and the second resin layer include at least one of phosphors or a light diffusing agent.

17. The light emitting device package according to claim 16, wherein the first and second lead frames wrap around the first and second side surfaces, respectively, and include second ends terminating at the second surface, and the first and second lead frames extend along a side surface of the second cavity.

18. A lighting system comprising:

a substrate; and light emitting device packages mounted on the substrate, wherein each of the light emitting device packages includes:

a body having first and second surfaces, a plurality of side surfaces provided between the first and second surfaces, and a cavity formed on the first surface;

a first lead frame extending from a first side surface and through the body such than a first end protrudes into the cavity;

a second lead frame extending from a second side surface and through the body such that a first end protrudes into the cavity, wherein a gap is provided between the first end of the first lead frame and the first end of the second lead frame;

a light emitting device provided between the gap, the light emitting device having layers of a first conductive type semiconductor layer, an active layer and a second conductive type semiconductor layer, the layers being stacked in a direction parallel to a bottom surface of the cavity, wherein the first end of the first lead frame includes a first light transmissive electrode, and the first end of the second lead frame includes a second light transmissive electrode, the light emitting device electrically contacting the first and second light transmissive electrodes; and an adhesive layer in contact with the light emitting device, the bottom of the cavity, and the first and second light transmissive electrodes.

* * * * *